US009649723B2

(12) United States Patent
Umeda et al.

(10) Patent No.: US 9,649,723 B2
(45) Date of Patent: May 16, 2017

(54) PROCESSING APPARATUS INCLUDING LASER BEAM APPLYING MECHANISM AND SEPARATING MEANS

(71) Applicant: DISCO CORPORATION, Tokyo (JP)

(72) Inventors: Yoshio Umeda, Tokyo (JP); Satoshi Kobayashi, Tokyo (JP); Yasuyoshi Yubira, Tokyo (JP)

(73) Assignee: Disco Corporation, Tokyo (JP)

( * ) Notice: Subject to any disclaimer, the term of this patent is extended or adjusted under 35 U.S.C. 154(b) by 197 days.

(21) Appl. No.: 14/444,465

(22) Filed: Jul. 28, 2014

(65) Prior Publication Data

US 2015/0038062 A1 Feb. 5, 2015

(30) Foreign Application Priority Data

Aug. 1, 2013 (JP) ................................ 2013-160420

(51) Int. Cl.
| | |
|---|---|
| *B23K 26/40* | (2014.01) |
| *B23K 26/00* | (2014.01) |
| *B23K 26/08* | (2014.01) |
| *B24B 7/22* | (2006.01) |
| *H01L 21/67* | (2006.01) |
| *B23K 103/00* | (2006.01) |

(52) U.S. Cl.
CPC ...... *B23K 26/0093* (2013.01); *B23K 26/0054* (2013.01); *B23K 26/08* (2013.01); *B23K 26/40* (2013.01); *B24B 7/228* (2013.01); *H01L 21/67092* (2013.01); *H01L 21/67115* (2013.01); *H01L 21/67219* (2013.01); *B23K 2203/50* (2015.10)

(58) Field of Classification Search
CPC . B23K 26/0093; B23K 26/0054; B23K 26/08
See application file for complete search history.

(56) References Cited

U.S. PATENT DOCUMENTS 4,407,262 A * 10/1983 Wirz ................... B23D 59/008
125/13.01
5,351,446 A * 10/1994 Langsdorf ............. B28D 1/003
125/13.02

(Continued)

FOREIGN PATENT DOCUMENTS

JP 10-256203 9/1998

*Primary Examiner* — Joseph J Hail
*Assistant Examiner* — Joel Crandall
(74) *Attorney, Agent, or Firm* — Greer Burns & Crain Ltd.

(57) ABSTRACT

A processing apparatus including a chuck table having a holding surface for rotatably holding a workpiece, a laser beam applying mechanism having a laser beam generating unit for generating a laser beam and focusing the laser beam to the inside of the workpiece held on the chuck table, a relatively moving unit for relatively moving the chuck table and the laser beam applying mechanism in a direction parallel to the holding surface of the chuck table while applying the laser beam to the workpiece to thereby form a modified layer inside of the workpiece, a separating unit for separating a part of the workpiece along the modified layer as a boundary formed inside the workpiece, and a grinding/polishing unit having a grinding/polishing wheel for grinding or polishing the modified layer left on the workpiece after separating the part and a spindle for rotatably mounting the grinding/polishing wheel.

1 Claim, 4 Drawing Sheets

(56) References Cited

U.S. PATENT DOCUMENTS

| | | | | | |
|---|---|---|---|---|---|
| 5,679,060 A | * | 10/1997 | Leonard | ................ | B24B 41/005 |
| | | | | | 451/285 |
| 5,830,045 A | * | 11/1998 | Togawa | .................. | B24B 37/04 |
| | | | | | 451/288 |
| 6,036,582 A | * | 3/2000 | Aizawa | .................. | B23Q 37/00 |
| | | | | | 451/288 |
| 6,379,230 B1 | * | 4/2002 | Hayashi | .............. | B24B 27/0023 |
| | | | | | 451/287 |
| 2010/0009549 A1 | * | 1/2010 | Sekiya | ............... | B23K 26/0057 |
| | | | | | 438/795 |

* cited by examiner

PROCESSING APPARATUS INCLUDING LASER BEAM APPLYING MECHANISM AND SEPARATING MEANS

BACKGROUND OF THE INVENTION

Field of the Invention

The present invention relates to a processing apparatus for processing a workpiece such as an ingot formed of a semiconductor material.

Description of the Related Art

A wafer to be used in the manufacture of semiconductor devices is usually obtained by slicing an ingot formed of a semiconductor material such as silicon, silicon carbide, and gallium nitride with a tool such as a band saw and a wire saw and next polishing both sides of a sliced part of the ingot (see Japanese Patent Laid-open No. Hei 10-256203, for example).

It is not easy to thinly slice the ingot by using a tool such as a band saw and a wire saw, thereby obtaining a wafer having a small thickness. To meet the recent demand for a reduction in thickness of the wafer, a relatively thick wafer is ground to reduce the thickness of the wafer.

SUMMARY OF THE INVENTION

However, most of the relatively thick wafer is removed by grinding in this method. Accordingly, this method is uneconomical in the points of the number of steps, use efficiency of the semiconductor material, etc. Further, in the case of slicing the ingot by using a tool such as a band saw and a wire saw, at least a portion of the ingot corresponding to the thickness of the tool is lost, causing an increase in loss.

It is therefore an object of the present invention to provide a processing apparatus which can process a workpiece such as an ingot without loss.

In accordance with an aspect of the present invention, there is provided a processing apparatus including holding means having a holding surface for rotatably holding a workpiece; a laser beam applying mechanism having laser beam generating means for generating a laser beam and focusing means for focusing the laser beam generated by the laser beam generating means to the inside of the workpiece held by the holding means; relatively moving means for relatively moving the holding means and the laser beam applying mechanism in a direction parallel to the holding surface of the holding means while applying the laser beam to the workpiece to thereby form a modified layer inside of the workpiece; separating means for separating a part of the workpiece along the modified layer as a boundary formed inside the workpiece; and grinding/polishing means having a grinding/polishing wheel for grinding or polishing the modified layer left on the workpiece after separating the part and a spindle for rotatably mounting the grinding/polishing wheel.

Preferably, the processing apparatus further includes positioning means for selectively positioning the holding means to a laser processing position corresponding to the laser beam applying mechanism and a grinding/polishing position corresponding to the grinding/polishing means.

As described above, the processing apparatus of the present invention includes the holding means having the holding surface for rotatably holding the workpiece, the laser beam applying mechanism for applying the laser beam to the workpiece so as to form the modified layer inside the workpiece, the relatively moving means for relatively moving the holding means and the laser beam applying mechanism in the direction parallel to the holding surface, and the separating means for separating a part of the workpiece along the modified layer as a boundary.

With this configuration, a part of the workpiece can be separated from the workpiece along the modified layer as a boundary formed by the application of the laser beam. That is, cutting of the workpiece by the use of any tool such as a band saw and a wire saw is not required in the present invention, so that a portion of the workpiece corresponding to the thickness of the tool is not lost.

Further, by adjusting the depth of the modified layer to be formed inside the workpiece, a part of the workpiece can be separated so as to have a small thickness. Accordingly, it is possible to prevent poor economy such that a thick part of the workpiece is separated by cutting and thereafter ground to reduce the thickness of the separated part. Thusly, according to the present invention, a processing apparatus can be provided in which the workpiece such as an ingot can be processed without loss.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
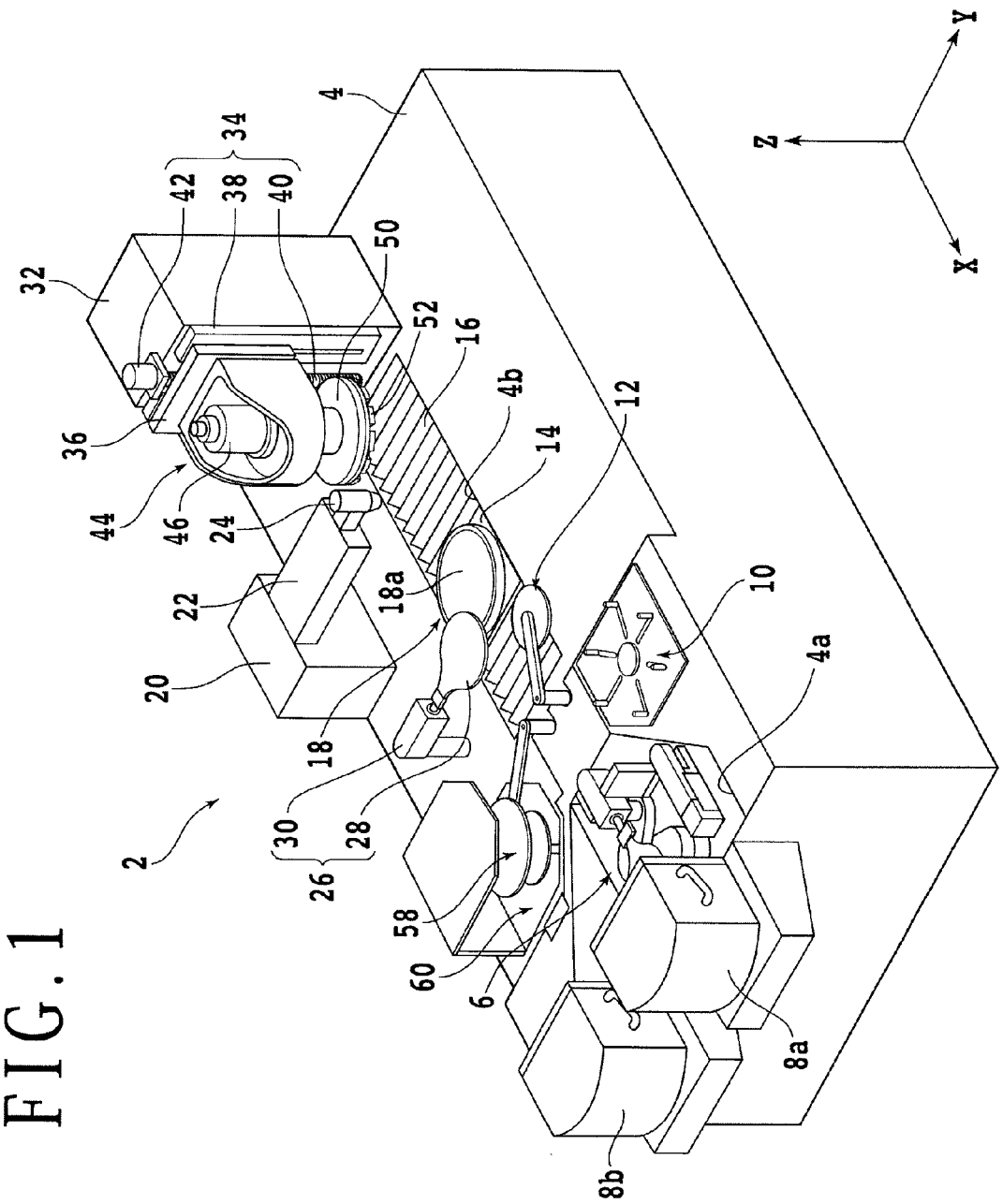
FIG. 1 is a perspective view schematically showing the configuration of a processing apparatus according to a preferred embodiment of the present invention.

A preferred embodiment of the present invention will now be described in detail with reference to the attached drawings. FIG. 1 is a perspective view schematically showing the configuration of a processing apparatus 2 according to this preferred embodiment. As shown in FIG. 1, the processing apparatus 2 has a base 4 for supporting various parts. An opening 4a is formed on the upper surface of the base 4 at a front end portion thereof. A handling mechanism 6 for handling a workpiece 11 (see FIG. 2, for example) to be processed is provided inside the opening 4a. There are placed in an area on the front side of the opening 4a a cassette 8a for storing the workpiece 11 and a cassette 8b for storing a platelike member (not shown) separated from the workpiece 11.

The workpiece 11 is an ingot formed of a semiconductor material such as silicon, silicon carbide, and gallium nitride. The workpiece 11 has a solid cylindrical and a size allowed to be handled by the handling mechanism 6 or the like. However, the configuration of the workpiece 11 is not limited to the above.

A positioning mechanism 10 for temporarily placing the workpiece 11 and positioning the workpiece 11 is located on the rear side of the opening 4a and the area where the cassette 8a is placed. For example, the positioning mechanism 10 is adapted to center the workpiece 11 taken out of the cassette 8a by the handling mechanism 6 and temporarily placed in the positioning mechanism 10. A loading mechanism 12 for loading the workpiece 11 under suction is pivotably provided adjacent to the positioning mechanism 10. The loading mechanism 12 is adapted to hold under suction the front side (upper surface) 11a of the workpiece 11 positioned by the positioning mechanism 10 and then carry the workpiece 11 to a given position on the rear side of the positioning mechanism 10.

An opening 4b is formed on the upper surface of the base 4 in an area on the rear side of the loading mechanism 12. There are provided inside the opening 4b an X-axis movable table 14, an X-axis moving mechanism (relatively moving means, positioning means) (not shown) for moving the X-axis movable table 14 in the X direction (longitudinal direction) shown by an arrow X in FIG. 1, and a waterproof cover 16 for covering the X-axis moving mechanism. The X-axis moving mechanism includes a pair of parallel X-axis guide rails (not shown) extending in the X direction, and the X-axis movable table 14 is slidably supported on the X-axis guide rails. A nut (not shown) is fixed to the lower surface of the X-axis movable table 14, and an X-axis ball screw (not shown) extending parallel to the X-axis guide rails is threadedly engaged with this nut. An X-axis pulse motor (not shown) is connected to one end of the X-axis ball screw. Accordingly, when the X-axis ball screw is rotated by the X-axis pulse motor, the X-axis movable table 14 is moved along the X-axis guide rails in the X direction.

A chuck table (holding means) 18 for holding the workpiece 11 under suction is provided on the X-axis movable table 14. The chuck table 18 is connected to a rotational drive mechanism (relatively moving means) (not shown) such as a motor, so that the chuck table 18 is rotatable about a vertical axis extending in the vertical direction (Z direction) shown by an arrow Z in FIG. 1. The chuck table 18 is movable in the X direction by the X-axis moving mechanism mentioned above so as to selectively take a front position as a loading/unloading position where the workpiece 11 or the platelike member separated from the workpiece 11 is loaded or unloaded, a rear position as a grinding/polishing position where the workpiece 11 is ground or polished, and a central position as a laser processing position where the workpiece 11 is laser-processed. The upper surface of the chuck table 18 functions as a holding surface 18a for holding the workpiece 11 under suction. The holding surface 18a is connected through a passage (not shown) formed in the chuck table 18 to a vacuum source (not shown). The workpiece 11 loaded to the chuck table 18 by the loading mechanism 12 is held under suction by a vacuum applied from the vacuum source to the holding surface 18a of the chuck table 18 in the condition where the back side (lower surface) 11b of the workpiece 11 is in contact with the holding surface 18a.

A support column 20 is provided in the vicinity of the laser processing position mentioned above so as to extend upward from the upper surface of the base 4. A support arm 22 is provided on one side surface of the support column 20 so as to extend toward the upper side of the opening 4b in the Y direction shown by an arrow Y in FIG. 1. A laser beam applying mechanism 24 is provided at the front end of the support arm 22. The laser beam applying mechanism 24 includes a laser oscillator (laser beam generating means) (not shown) for oscillating a laser beam L (see FIG. 2) and a focusing unit (focusing means) 24a (see FIG. 2) for focusing the laser beam L oscillated by the laser oscillator to a position inside the workpiece 11 held on the chuck table 18. After the workpiece 11 loaded by the loading mechanism 12 is held under suction on the chuck table 18 set at the loading/unloading position, the chuck table 18 is moved to the laser processing position to thereby position the workpiece 11 below the laser beam applying mechanism 24. The laser beam applying mechanism 24 is adapted to generate the laser beam L having a given wavelength where energy is hard to absorb in the workpiece 11 and then focus this laser beam L inside the workpiece 11, thereby forming a modified layer 11c (see FIG. 3) due to multiphoton absorption.

A separating mechanism (separating means) 26 for separating a part of the workpiece 11 near the front side 11a after forming the modified layer 11c in the workpiece 11 is located on the front side of the laser beam applying mechanism 24. The separating mechanism 26 includes a suction pad 28 for sucking the front side 11a of the workpiece 11 and a drive mechanism 30 for vertically moving and rotating the suction pad 28. After the modified layer 11c is formed inside the workpiece 11, the chuck table 18 is moved to the loading/unloading position to thereby position the workpiece 11 below the suction pad 28. Thereafter, the suction pad 28 is lowered to suck the front side 11a of the workpiece 11. As a result, the workpiece 11 is separated into two parts with the modified layer 11c serving as a boundary, wherein one of the two parts is attached to the chuck table 18 and the other is attached to the suction pad 28. That is, a part (platelike member) of the workpiece 11 is separated from the workpiece 11 along the modified layer 11c as a boundary.

A support column 32 is located on the rear side of the laser beam applying mechanism 24 so as to extend upward from the upper surface of the base 4. A Z-axis movable table 36 is provided on the front surface of the support column 32 through a Z-axis moving mechanism 34. The Z-axis moving mechanism 34 includes a pair of parallel Z-axis guide rails 38 extending in the Z direction, and the Z-axis movable table 36 is slidably supported on the Z-axis guide rails 38. A nut (not shown) is fixed to the rear surface (back surface) of the Z-axis movable table 36, and a Z-axis ball screw 40 extending parallel to the Z-axis guide rails 38 is threadedly engaged with this nut. A Z-axis pulse motor 42 is connected to one end of the Z-axis ball screw 40. Accordingly, when the Z-axis ball screw 40 is rotated by the Z-axis pulse motor 42, the Z-axis movable table 36 is moved along the Z-axis guide rails 38 in the Z direction.

Figure 4:
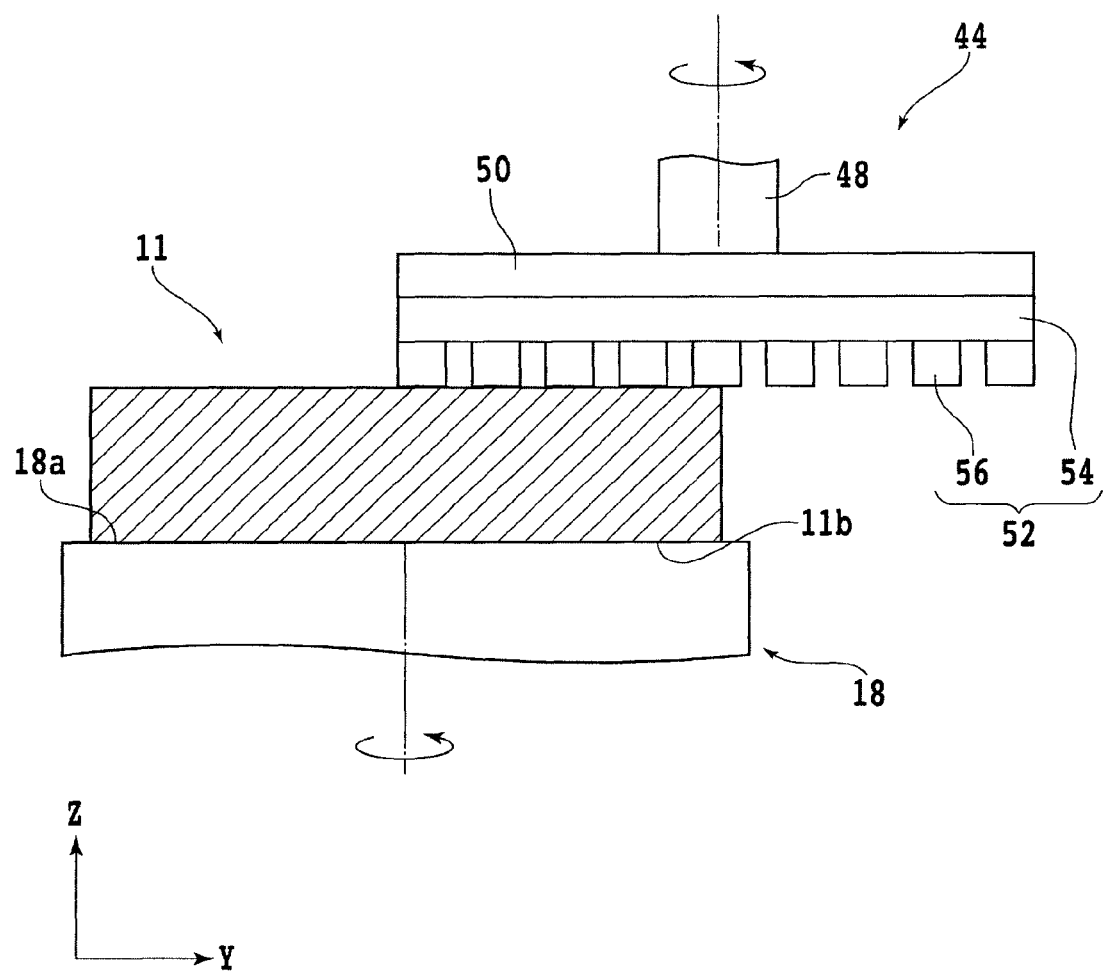
FIG. 4 is a partially sectional side view schematically showing a grinding/polishing step in the processing method.

A grinding/polishing mechanism (grinding/polishing means) 44 for grinding or polishing the workpiece 11 is provided on the front surface of the Z-axis movable table 36. The grinding/polishing mechanism 44 includes a spindle housing 46 fixed to the Z-axis movable table 36. A spindle 48 (see FIG. 4) is rotatably supported to the spindle housing 46. A wheel mount 50 is fixed to the lower end of the spindle 48, and a grinding/polishing wheel 52 is mounted on the lower surface of the wheel mount 50. As shown in FIG. 4, the grinding/polishing wheel 52 includes a cylindrical wheel base 54 formed of a metal material such as aluminum and stainless steel and a plurality of abrasive members 56 annularly arranged on the lower surface of the wheel base 54. After a part (platelike member) of the workpiece 11 is separated from the workpiece 11 along the modified layer 11c as a boundary by the separating mechanism 26 mentioned above, the chuck table 18 holding the remaining part of the workpiece 11 is moved to the grinding/polishing position to thereby position the remaining workpiece 11 below the grinding/polishing mechanism 44. Thereafter, the chuck table 18 and the grinding/polishing wheel 52 are rotated and the grinding/polishing mechanism 44 is lowered by the Z-axis moving mechanism 34 to bring the abrasive members 56 of the grinding/polishing wheel 52 into contact with the workpiece 11. As a result, the modified layer 11c left on the workpiece 11 is removed.

An unloading mechanism 58 for unloading the platelike member separated from the workpiece 11 under suction is pivotably provided adjacent to the loading mechanism 12. Further, a cleaning mechanism 60 for cleaning the platelike member unloaded by the unloading mechanism 58 is located close to the unloading mechanism 58. The platelike member cleaned by the cleaning mechanism 60 is carried by the handling mechanism 6 and stored into the cassette 8b.

There will now be described a processing method for the workpiece 11 by the processing apparatus 2. First, a loading step is performed in such a manner that the workpiece 11 stored in the cassette 8a is loaded to the chuck table 18 by using the handling mechanism 6 and the loading mechanism 12. In this loading step, the workpiece 11 is loaded to the chuck table 18 in the condition where the back side 11b of the workpiece 11 is in contact with the holding surface 18a of the chuck table 18. After loading the workpiece 11 to the chuck table 18 as mentioned above, a vacuum is applied to the holding surface 18a to thereby hold the workpiece 11 on the chuck table 18 under suction.

Figure 2:
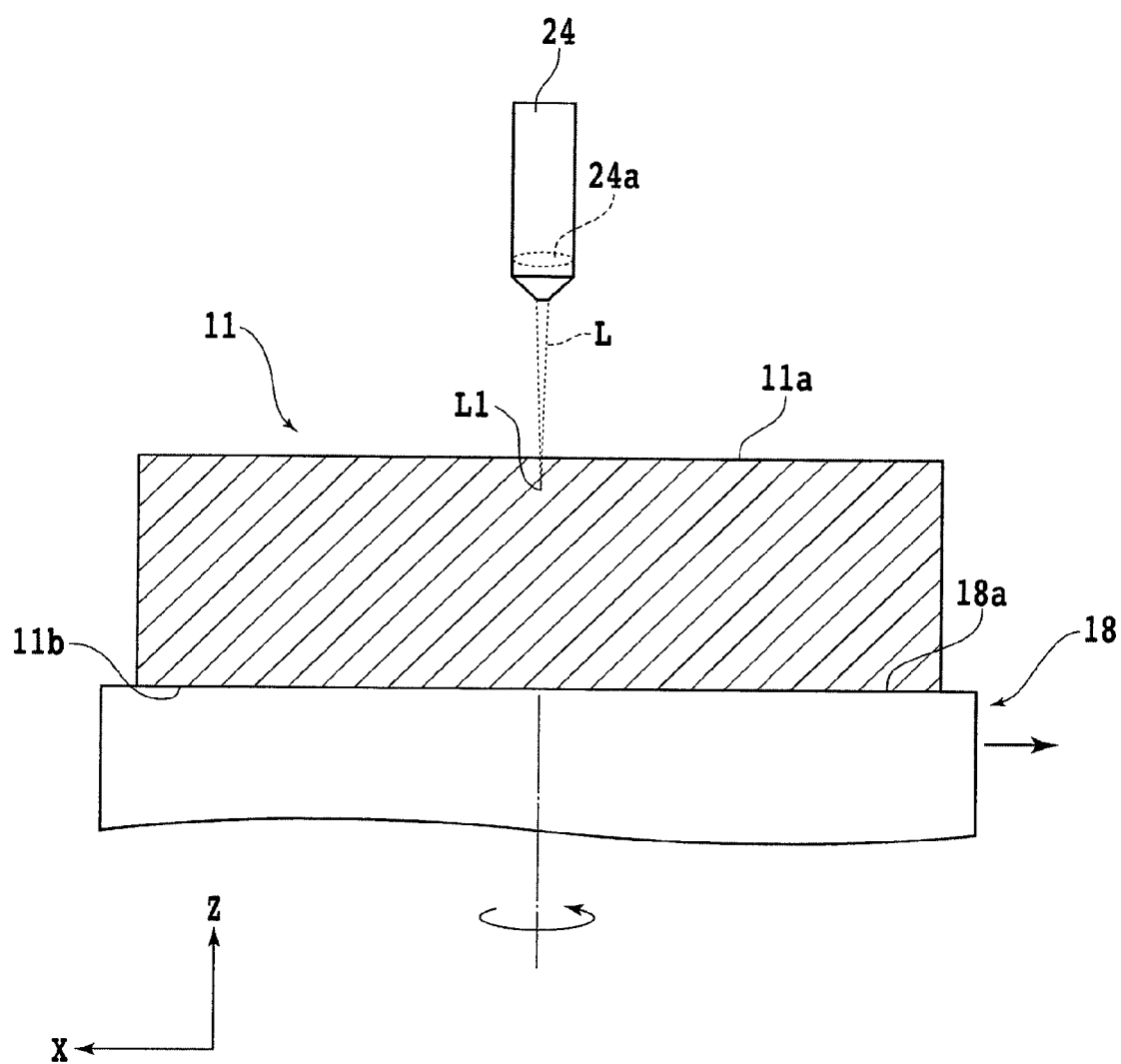
FIG. 2 is a partially sectional side view schematically showing a modified layer forming step in a processing method according to this preferred embodiment.

Thereafter, a modified layer forming step is performed in such a manner that the laser beam L is applied to the workpiece 11 to thereby form the modified layer 11c inside the workpiece 11. FIG. 2 is a partially sectional side view schematically showing the modified layer forming step in the processing method of this embodiment. As shown in FIG. 2, the chuck table 18 is moved to the laser processing position close to the laser beam applying mechanism 24. At this laser processing position, the laser beam L is applied from the laser beam applying mechanism 24 toward the workpiece 11. The laser beam L is applied under the processing conditions including a wavelength and power capable of suitably modifying the workpiece 11. The focal point L1 of the laser beam L is set inside the workpiece 11 so that the platelike member having a desired thickness can be separated from the workpiece 11. Further, in applying the laser beam L, the chuck table 18 is rotated and moved at a low speed in the X direction parallel to the holding surface 18a. That is, the chuck table 18 and the laser beam applying mechanism 24 are relatively moved in a direction (holding surface direction) parallel to the holding surface 18a. As a result, the focal point L1 of the laser beam L is moved so as to describe a spiral locus at a predetermined depth inside the workpiece 11. Accordingly, the modified layer 11c parallel to the holding surface 18a is formed at this predetermined depth inside the workpiece 11. The rotational speed and feed speed of the chuck table 18 are adjusted so that the modified layer 11c is suitable for the separation of the platelike member from the workpiece 11.

Figure 3:
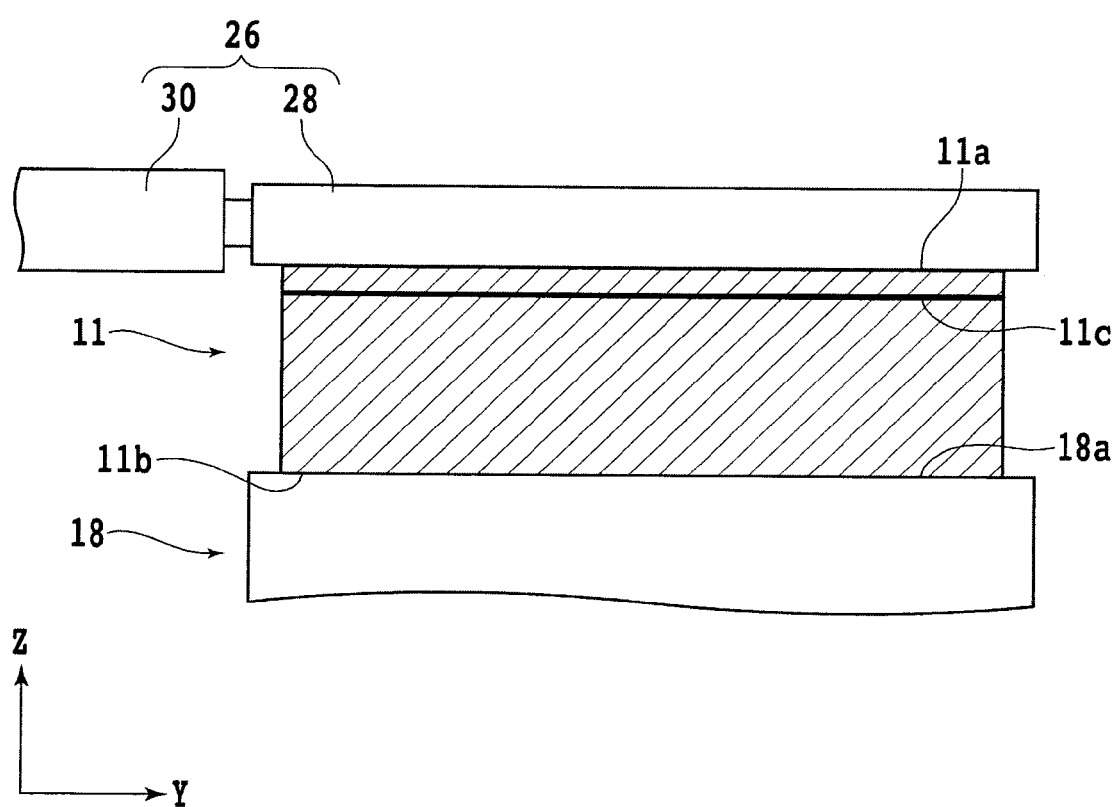
FIG. 3 is a partially sectional side view schematically showing a separating step in the processing method.

After performing the modified layer forming step, a separating step is performed in such a manner that the platelike member is separated from the workpiece 11 along the modified layer 11c as a boundary. FIG. 3 is a partially sectional side view schematically showing the separating step. In this separating step, the chuck table 18 is first moved to the loading/unloading position close to the separating mechanism 26. Thereafter, the suction pad 28 is lowered by the drive mechanism 30 to bring the lower surface (suction surface) of the suction pad 28 into contact with the front side 11a of the workpiece 11. In this condition, the workpiece 11 is sucked by the suction pad 28. Accordingly, stress is applied to the modified layer 11c to thereby separate a part (platelike member) of the workpiece 11 along the modified layer 11c near the front side 11a of the workpiece 11.

After performing the separating step as mentioned above, an unloading step is performed in such a manner that the platelike member separated from the workpiece 11 and held by the separating mechanism 26 is unloaded by the unloading mechanism 58. At the same time, a grinding/polishing step is performed in such a manner that the remaining workpiece 11 held on the chuck table 18 is ground or polished by the grinding/polishing mechanism 44. FIG. 4 is a partially sectional side view schematically showing the grinding/polishing step. In the unloading step, the suction pad 28 is raised and rotated 180 degrees about a horizontal axis extending in the Y direction. As a result, the platelike member separated from the workpiece 11 and held by the suction pad 28 is oriented upward so that the platelike member can be held under suction by the unloading mechanism 58. Thereafter, the platelike member is held under suction by the unloading mechanism 58 and unloaded to the cleaning mechanism 60. The platelike member cleaned by the cleaning mechanism 60 is carried by the handling mechanism 6 and stored into the cassette 8b.

On the other hand, the grinding/polishing step is performed in the following manner. First, the chuck table 18 holding the remaining workpiece 11 is moved to the grinding/polishing position to thereby position the workpiece 11 below the grinding/polishing mechanism 44. Thereafter, the chuck table 18 and the grinding/polishing wheel 52 are rotated and the grinding/polishing mechanism 44 is lowered by the Z-axis moving mechanism 34 to bring the abrasive members 56 of the grinding/polishing wheel 52 into contact with the workpiece 11. Accordingly, the workpiece 11 is ground or polished to thereby remove the modified layer 11c left on the upper surface of the workpiece 11. After this grinding/polishing step is finished, the modified layer forming step, the separating step, and the grinding/polishing step are repeatedly performed to continuously process the workpiece 11.

As described above, the processing apparatus 2 according to this preferred embodiment includes the chuck table (holding means) 18 having the holding surface 18a for rotatably holding the workpiece 11, the laser beam applying mechanism 24 for applying the laser beam L to the workpiece 11 so as to form the modified layer 11c inside the workpiece 11, the X-axis moving mechanism and the rotational drive mechanism (relatively moving means) for relatively moving the chuck table 18 and the laser beam applying mechanism 24 in the direction parallel to the holding surface 18a, and the separating mechanism (separating means) 26 for separating a part of the workpiece 11 along the modified layer 11c as a boundary.

With this configuration, a part of the workpiece 11 can be separated from the workpiece 11 along the modified layer 11c as a boundary formed by the application of the laser beam L. That is, cutting of the workpiece 11 by the use of any tool such as a band saw and a wire saw is not required in this preferred embodiment, so that a portion of the workpiece 11 corresponding to the thickness of the tool is not lost.

Further, by adjusting the depth of the modified layer 11c to be formed inside the workpiece 11, a part of the workpiece 11 can be separated so as to have a small thickness. Accordingly, it is possible to prevent poor economy such that a thick part of the workpiece 11 is separated by cutting and thereafter ground to reduce the thickness of the separated part. Thusly, according to the processing apparatus 2, the workpiece 11 such as an ingot can be processed without loss.

The present invention is not limited to the above preferred embodiment, but various modifications may be made. For example, while an ingot formed of a semiconductor material is used as the workpiece 11 in the above preferred embodiment, the processing apparatus of the present invention can be used also in thinning a wafer or the like having a general thickness. That is, a wafer or the like may be used as the workpiece 11.

Further, the processing apparatus of the present invention can be used also in thinning a wafer having devices formed on the front side. In this case, the processing method mentioned above may be performed in place of the back grinding of the wafer.

Further, while the laser beam L is a single-spot beam in the above preferred embodiment, the laser beam L may be a multispot beam. For example, a laser beam L shaped by using a technique as disclosed in Japanese Patent Laid-open No. 2011-79044 may be applied to the workpiece 11. By using a multispot beam as the laser beam L, the modified layer 11c can be formed in a short time.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus comprising:
   holding means having a holding surface for rotatably holding an ingot;
   a holding table for selectively positioning said holding means to a laser processing position corresponding to said laser beam applying mechanism and an abrading position corresponding to said abrading means;
   a laser beam applying mechanism having laser beam generating means for generating a laser beam and focusing means for focusing said laser beam generated by said laser beam generating means to the inside of said ingot held by said holding means;
   relatively moving means for relatively moving said holding means and said laser beam applying mechanism in a direction parallel to said holding surface of said holding means while applying the laser beam to said ingot to thereby form a modified layer inside of said ingot;
   separating means for separating a part of said ingot along said modified layer as a boundary formed inside said ingot; and
   abrading means having an abrasive wheel for abrading said modified layer left on said ingot after separating said part and a spindle for rotatably mounting said abrading wheel.

* * * * *